United States Patent
Freer et al.

(10) Patent No.: US 8,475,599 B2
(45) Date of Patent: Jul. 2, 2013

(54) SUBSTRATE PREPARATION USING STABILIZED FLUID SOLUTIONS AND METHODS FOR MAKING STABLE FLUID SOLUTIONS

(75) Inventors: Erik M. Freer, Campbell, CA (US); John M. de Larios, Palo Alto, CA (US); Michael Ravkin, Sunnyvale, CA (US); Mikhail Korolik, San Jose, CA (US); Katrina Mikhaylichenko, San Jose, CA (US); Fritz C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 995 days.

(21) Appl. No.: 11/641,362

(22) Filed: Dec. 18, 2006

(65) Prior Publication Data

US 2007/0155640 A1 Jul. 5, 2007

Related U.S. Application Data (60) Provisional application No. 60/755,377, filed on Dec. 30, 2005.

(51) Int. Cl.
*B08B 7/00* (2006.01)

(52) U.S. Cl.
USPC ...................... 134/6; 257/E21.304

(58) Field of Classification Search
None
See application file for complete search history.

(56) References Cited

U.S. PATENT DOCUMENTS

| | | | |
|---|---|---|---|
| 3,037,887 A | 6/1962 | Brenner et al. | 134/22 |
| 3,212,762 A | 10/1965 | Carroll et al. | 261/124 |
| 3,436,262 A | 4/1969 | Crowe et al. | 134/10 |
| 3,617,095 A | 11/1971 | Lissant | 406/197 |
| 3,978,176 A | 8/1976 | Voegeli | 261/122 |
| 4,085,059 A | 4/1978 | Smith et al. | 134/26 |
| 4,133,773 A | 1/1979 | Simmons | 261/21 |
| 4,156,619 A | 5/1979 | Griesshammer | 134/2 |
| 4,238,244 A | 12/1980 | Banks | 134/22 |
| 4,781,764 A | 11/1988 | Leenaars | 134/34 |
| 4,817,652 A | 4/1989 | Liu et al. | 134/102 |

(Continued)

FOREIGN PATENT DOCUMENTS

| | | |
|---|---|---|
| DE | 40-38-587 | 6/1992 |
| EP | 0827188 | 3/1998 |

(Continued)

OTHER PUBLICATIONS

Kittle, et al.; "Photoresist Removal Using Aqueous Foam"; Internet; http://www.aquafoam.com/paper/SCCPresentation.pdf.

(Continued)

*Primary Examiner* — Eric Golightly
(74) *Attorney, Agent, or Firm* — Martine Penilla Group, LLP (57) ABSTRACT

A method for making a solution for use in preparing a surface of a substrate is provided. The method includes providing a continuous medium that adds a polymer material to the continuous medium. A fatty acid is adding to the continuous medium having the polymer material, and the polymer material defines a physical network that exerts forces in the solution that overcome buoyancy forces experienced by the fatty acid, thus preventing the fatty acids from moving within the solution until a yield stress of the polymer material is exceeded by an applied agitation. The applied agitation is from transporting the solution from a container to a preparation station that applies the solution to the surface of the substrate.

12 Claims, 5 Drawing Sheets

U.S. PATENT DOCUMENTS

| | | | | |
|---|---|---|---|---|
| 4,838,289 A | 6/1989 | Kottman et al. | | 134/153 |
| 4,849,027 A | 7/1989 | Simmons | | 134/22 |
| 4,911,761 A | 3/1990 | McConnell et al. | | 134/11 |
| 4,962,776 A | 10/1990 | Liu et al. | | 134/11 |
| 5,000,795 A | 3/1991 | Chung et al. | | 134/37 |
| 5,048,549 A | 9/1991 | Hethcoat | | 134/122 R |
| 5,102,777 A | 4/1992 | Lin et al. | | 430/331 |
| 5,105,556 A | 4/1992 | Kurokawa et al. | | 34/12 |
| 5,113,597 A | 5/1992 | Sylla | | 34/22 |
| 5,175,124 A | 12/1992 | Winebarger | | 437/180 |
| 5,181,985 A | 1/1993 | Lampert et al. | | 156/635 |
| 5,226,969 A | 7/1993 | Watanabe et al. | | 134/7 |
| 5,242,669 A | 9/1993 | Flor | | 423/465 |
| 5,271,774 A | 12/1993 | Leenaars et al. | | 134/31 |
| 5,288,332 A | 2/1994 | Pustilnik et al. | | 134/27 |
| 5,306,350 A | 4/1994 | Hoy et al. | | 134/22.14 |
| 5,336,371 A | 8/1994 | Chung et al. | | 156/659.1 |
| 5,415,191 A | 5/1995 | Mashimo et al. | | 134/102.1 |
| 5,417,768 A | 5/1995 | Smith, Jr. et al. | | 134/10 |
| 5,464,480 A | 11/1995 | Matthews | | 134/1.3 |
| 5,472,502 A | 12/1995 | Batchelder | | 118/52 |
| 5,494,526 A | 2/1996 | Paranjpe | | 134/1 |
| 5,498,293 A | 3/1996 | Ilardi et al. | | 134/3 |
| 5,656,097 A | 8/1997 | Olesen et al. | | 134/1 |
| 5,660,642 A | 8/1997 | Britten | | 134/30 |
| 5,705,223 A | 1/1998 | Bunkofske | | 427/240 |
| 5,800,626 A | 9/1998 | Cohen et al. | | 134/1.3 |
| 5,858,283 A | 1/1999 | Burris | | 261/122.1 |
| 5,900,191 A | 5/1999 | Gray et al. | | 261/59 |
| 5,904,156 A | 5/1999 | Advocate, Jr. et al. | | 134/2 |
| 5,908,509 A | 6/1999 | Olesen et al. | | 134/1.3 |
| 5,911,837 A | 6/1999 | Matthews | | 134/2 |
| 5,932,493 A | 8/1999 | Akatsu et al. | | 438/745 |
| 5,944,581 A | 8/1999 | Goenka | | 431/39 |
| 5,944,582 A | 8/1999 | Talieh | | 451/41 |
| 5,945,351 A | 8/1999 | Mathuni | | 438/706 |
| 5,951,779 A | 9/1999 | Koyanagi et al. | | 134/2 |
| 5,964,954 A | 10/1999 | Matsukawa et al. | | 134/6 |
| 5,964,958 A | 10/1999 | Ferrell et al. | | 134/26 |
| 5,968,285 A | 10/1999 | Ferrell et al. | | 134/26 |
| 5,997,653 A | 12/1999 | Yamasaka | | 134/2 |
| 6,042,885 A * | 3/2000 | Woollard et al. | | 427/236 |
| 6,048,409 A | 4/2000 | Kanno et al. | | 134/34 |
| 6,049,996 A | 4/2000 | Freeman et al. | | 34/362 |
| 6,081,650 A | 6/2000 | Lyons et al. | | 386/95 |
| 6,090,217 A | 7/2000 | Kittle | | 134/11 |
| 6,092,538 A | 7/2000 | Arai et al. | | 134/1.3 |
| 6,152,805 A | 11/2000 | Takahashi | | 451/36 |
| 6,158,445 A | 12/2000 | Olesen et al. | | 134/1.3 |
| 6,167,583 B1 | 1/2001 | Miyashita et al. | | 15/77 |
| 6,228,563 B1 | 5/2001 | Starov et al. | | 430/327 |
| 6,267,125 B1 | 7/2001 | Bergman et al. | | 134/102.1 |
| 6,270,584 B1 | 8/2001 | Ferrell et al. | | 134/26 |
| 6,272,712 B1 | 8/2001 | Gockel et al. | | 15/77 |
| 6,276,459 B1 | 8/2001 | Herrick et al. | | 169/14 |
| 6,286,231 B1 | 9/2001 | Bergman et al. | | 34/410 |
| 6,290,780 B1 | 9/2001 | Ravkin | | 134/6 |
| 6,296,715 B1 | 10/2001 | Kittle | | 134/2 |
| 6,319,801 B1 | 11/2001 | Wake et al. | | 438/585 |
| 6,352,082 B1 | 3/2002 | Mohindra et al. | | 134/25.4 |
| 6,386,956 B1 | 5/2002 | Sato et al. | | 451/57 |
| 6,398,975 B1 | 6/2002 | Mertens et al. | | 216/92 |
| 6,401,734 B1 | 6/2002 | Morita et al. | | 134/153 |
| 6,423,148 B1 | 7/2002 | Aoki | | 134/3 |
| 6,439,247 B1 | 8/2002 | Kittle | | 134/102.1 |
| 6,457,199 B1 | 10/2002 | Frost et al. | | 15/77 |
| 6,491,043 B2 | 12/2002 | Mohindra et al. | | 134/25.4 |
| 6,491,764 B2 | 12/2002 | Mertens et al. | | 134/36 |
| 6,493,902 B2 | 12/2002 | Lin | | 15/302 |
| 6,513,538 B2 | 2/2003 | Chung et al. | | 134/1.2 |
| 6,514,921 B1 | 2/2003 | Kakizawa | | 510/175 |
| 6,527,870 B2 | 3/2003 | Gotkis | | 134/6 |
| 6,532,976 B1 | 3/2003 | Huh et al. | | 134/111 |
| 6,537,915 B2 | 3/2003 | Moore et al. | | 438/692 |
| 6,576,066 B1 | 6/2003 | Namatsu | | 134/30 |
| 6,594,847 B1 | 7/2003 | Krusell et al. | | 15/102 |
| 6,616,772 B2 | 9/2003 | de Larios et al. | | 134/21 |
| 6,733,596 B1 | 5/2004 | Mikhaylichenko et al. | | 134/60 |
| 6,787,473 B2 | 9/2004 | Andreas | | 438/692 |
| 6,797,071 B2 | 9/2004 | Kittle | | 134/11 |
| 6,802,911 B2 | 10/2004 | Lee et al. | | 134/28 |
| 6,846,380 B2 | 1/2005 | Dickinson et al. | | 156/354.31 |
| 6,851,435 B2 | 2/2005 | Mertens et al. | | 134/99.1 |
| 6,874,516 B2 | 4/2005 | Matsuno et al. | | 134/148 |
| 6,896,826 B2 | 5/2005 | Wojtczak et al. | | 252/79.1 |
| 6,927,176 B2 | 8/2005 | Verhaverbeke et al. | | 438/745 |
| 6,946,396 B2 | 9/2005 | Miyazawa et al. | | 438/689 |
| 6,951,042 B1 | 10/2005 | Mikhaylichenko et al. | | 15/77 |
| 7,122,126 B1 | 10/2006 | Fuentes | | 216/689 |
| 2002/0072482 A1 | 6/2002 | Sachdev et al. | | 510/175 |
| 2002/0094684 A1 | 7/2002 | Hirasaki et al. | | 438/689 |
| 2002/0121290 A1 | 9/2002 | Tang et al. | | 134/6 |
| 2002/0185164 A1 | 12/2002 | Tetsuka et al. | | 134/148 |
| 2002/0195121 A1 | 12/2002 | Kittle | | 134/3 |
| 2003/0075204 A1 | 4/2003 | de Larios et al. | | 134/21 |
| 2003/0148903 A1 | 8/2003 | Bargaje et al. | | 510/130 |
| 2003/0171239 A1 | 9/2003 | Patel et al. | | 510/406 |
| 2003/0226577 A1 | 12/2003 | Orll et al. | | 134/1.3 |
| 2004/0002430 A1 | 1/2004 | Verhaverbeke | | 510/175 |
| 2004/0053808 A1 | 3/2004 | Raehse et al. | | 510/447 |
| 2004/0069319 A1* | 4/2004 | Boyd et al. | | 134/1.3 |
| 2004/0134515 A1 | 7/2004 | Castrucci | | 134/2 |
| 2004/0159335 A1* | 8/2004 | Montierth et al. | | 134/10 |
| 2004/0163681 A1 | 8/2004 | Verhaverbeke | | 134/28 |
| 2004/0242442 A1* | 12/2004 | Fine et al. | | 510/108 |
| 2004/0261823 A1 | 12/2004 | de Larios | | 134/31 |
| 2005/0045209 A1 | 3/2005 | Tan | | 134/18 |
| 2005/0132515 A1 | 6/2005 | Boyd et al. | | 15/77 |
| 2005/0133060 A1 | 6/2005 | de Larios et al. | | 134/1.3 |
| 2005/0133061 A1 | 6/2005 | de Larios et al. | | 134/6 |
| 2005/0159322 A1 | 7/2005 | Min et al. | | 510/175 |
| 2005/0176606 A1 | 8/2005 | Konno et al. | | |
| 2005/0183740 A1 | 8/2005 | Fulton et al. | | 134/3 |
| 2006/0201267 A1 | 9/2006 | Liu | | 74/89.2 |
| 2006/0283486 A1 | 12/2006 | de Larios et al. | | 134/34 |
| 2006/0285930 A1 | 12/2006 | de Larios et al. | | 406/197 |
| 2007/0000518 A1 | 1/2007 | Korolik et al. | | |

FOREIGN PATENT DOCUMENTS

| | | |
|---|---|---|
| EP | 0905746 | 3/1999 |
| EP | 11-334874 | 12/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |
| JP | 2002-66475 | 3/2002 |
| JP | 2002-280330 | 9/2002 |
| JP | 2002-309638 | 10/2002 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 | 7/2005 |

OTHER PUBLICATIONS

Kittle, et al.; "Aqueous Foam Drying and Cleaning of Semiconductor Wafers"; Internet; http://www.aquafoam.com/paper/SCCPresentation.pdf.

Kittle, et al.; "Foam Wafer Cleaning—Experimental Proof of Concept"; Internet; http://www.aquafoam.com/paper/Removalall.pdf.

Kittle, et al.; "Particulate Removal Using a Foam Medium"; Internet; http://www.aquafoam.com/paper/particulate.pdf.

Kittle, et al. "Removing Particles with a Foam Medium" Internet http://www.aquafoam.com/paper/A2C2foamedium.pdf.

Aubert, JM et al.; "Aqueous foams"; Scientific America; 1986, 74-82, 254.

Kittle, et al.; "Semiconductor Wafer Cleaning and Drying Using a Foam Medium"; <hhttp://www.aquafoam.com/papers;SC10202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Is Foam Wafer Cleaning and Drying the Future?"; <http://www.aquafoam.com/papers/SCI0202.pdf>; Semiconductor International, 25, #2; Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Collloge, Dublin; 1999.

Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.

Lide; "Air Composition"; CRC handbook of Chemistry and Physics; 1997.

U.S. Appl. No. 11/639,752, filed Dec. 15, 2006, Boyd et al.

U.S. Appl. No. 11/743,283, filed May 2, 2007 Freer et al.

* cited by examiner

SUBSTRATE PREPARATION USING STABILIZED FLUID SOLUTIONS AND METHODS FOR MAKING STABLE FLUID SOLUTIONS

CLAIM OF PRIORITY

This application claims the benefit of U.S. Provisional Application No. 60/755,377, filed Dec. 30, 2005. The disclosure of the above-identified application is incorporated herein by reference.

CROSS REFERENCE TO RELATED APPLICATIONS

This application is related to U.S. patent application Ser. No. 10/816,337, filed on Mar. 31, 2004, and entitled "Apparatuses and Methods for Cleaning a Substrate," U.S. patent application Ser. No. 11/153,957, filed on Jun. 15, 2005, and entitled "Method and Apparatus for Cleaning a Substrate Using Non-Newtonian Fluids," U.S. patent application Ser. No. 11/154,129, filed on Jun. 15, 2005, and entitled "Method and Apparatus for Transporting a Substrate Using Non-Newtonian Fluid," U.S. patent application Ser. No. 11/174,080, filed on Jun. 30, 2005, and entitled "Method for Removing Material from Semiconductor Wafer and Apparatus for Performing the Same," U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," U.S. patent application Ser. No. 11/336,215, filed on Jan. 20, 2006, entitled "Method and Apparatus for removing contamination from a substrate," U.S. patent application Ser. No. 11/346,894, filed on Feb. 3, 2006, entitled "Method for removing contamination from a substrate and for making a cleaning solution," and U.S. patent Application Ser. No. 11/347,154, filed on Feb. 3, 2006, entitled "Cleaning compound and method and system for using the cleaning compound." The disclosure of each of the above-identified related applications is incorporated herein by reference.

BACKGROUND

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contamination from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

Conventional wafer cleaning methods have relied heavily on mechanical force to remove particulate contamination from the wafer surface. As feature sizes continue to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination. Particulate contamination of sufficiently small size can find its way into difficult to reach areas on the wafer surface, such as in a trench surrounded by high aspect ratio features. Thus, efficient and non-damaging removal of contaminants during modern semiconductor fabrication represents a continuing challenge to be met by continuing advances in wafer cleaning technology. It should be appreciated that the manufacturing operations for flat panel displays suffer from the same shortcomings of the integrated circuit manufacturing discussed above.

Many times, solutions that are engineered for cleaning surfaces are not sufficiently stable, and over time, their consistencies may change. An example of changes in consistencies is when materials in the solutions either float to the top or sink to the bottom. If this happens, there is a need for re-mixing, or reconfirming the solution so that it can still be applied to the surface of the substrate and the anticipated action/result of the solution will still be valid. For this reason, some solutions cannot be made and stored for later use, as the solution many not properly function without extra testing or reconditioning.

In view of the forgoing, there is a need for solutions that can be made, stored, and used at later times, without the need for extra testing, sampling, re-agitation, re-conditioning, re-mixing, or the like.

SUMMARY

Broadly speaking, the present invention fills these needs by providing a stable solution that can elastically hold solid materials in suspension, so that solid materials are not allowed to separate from the remainder of the cleaning solution. The solution preferably includes polymeric macromolecules that stabilize the solid particles in the fluid, so that the solid particles are prevented from either floating to the top of the solution or sinking to the bottom of the solution, due to the relative buoyancies of the solid particles to the continuous medium of the solution. In one embodiment, the polymeric macromolecules form a physical network with junctions that give the solution a finite yield stress. Thus, the physical network behaves as an elastic solid when deformed with stresses below the yield value. When stress above the yield stress is applied to the material, the network will yield resulting in a fluid like behavior of the solution. If the stress provided by the buoyancy force of the solid is below the yield stress of the continuous medium, then the solid particles will be trapped in the network unable to migrate. This physical network stabilizes the cleaning solution by keeping the particles suspended, but does not inhibit utility since the solution behaves as a fluid above the yield stress. In addition, the polymeric additives can give the solution elasticity which can provide a normal force to the wafer surface upon application, which promotes solid-wafer contact and better contamination removal.

It should be appreciated that the present invention can be implemented in numerous ways, including as an apparatus, a method and a system. Several inventive embodiments of the present invention are described below.

In one embodiment, a method for making a solution for use in preparing a surface of a substrate is provided. The method includes providing a continuous medium that adds a polymer material to the continuous medium. A fatty acid is added to the continuous medium having the polymer material, and the polymer material defines a physical network that exerts forces in the solution that overcome buoyancy forces experienced by the fatty acid, thus preventing the fatty acids from moving within the solution until a yield stress of the polymer material is exceeded by an applied agitation. The applied agitation is from transporting the solution from a container to a preparation station that applies the solution to the surface of the substrate.

In another embodiment, a method for using a solution for cleaning a substrate is provided. The method includes providing a solution in a container, where the solution is mixed from at least a continuous medium, a polymer material, and a solid material. The polymer material in the solution imparting a finite yield stress to the material, such that the solution is maintained in a stable elastic gel form. The stable elastic gel form is configured to hold the solid material from in place and prevent the solid material from moving in the solution if stresses less than the finite yield stress is imparted on the solution after synthesis of the solution and during any storage of the solution. The method further includes applying at least a minimum shear stress on the solution, and the minimum shear stress is at least greater than the finite yield stress so that the stable elastic gel form transforms from solid like to liquid like behavior. Then, flowing the solution from the container after imparting the minimum shear stress, where the solution that is flown from the container has a mixed consistency of the solid material in the solution. The method then includes applying the solution to a preparation system for application to a surface of the substrate.

In yet another embodiment, a substrate cleaning system is disclosed. The system includes a proximity head system for applying a meniscus to a surface of a substrate during a cleaning operation, where the meniscus is defined by a solution. The system includes a container for holding the solution, and the solution is mixed from at least a continuous medium, a polymer material, and a solid material, where the polymer material in the solution imparts a finite yield stress to the material that enables a stable elastic gel form. The stable elastic gel form is configured to hold the solid material form in place and prevent the solid material from moving in the solution if stresses less than the finite yield stress are imparted on the solution, after synthesis of the solution and during any storage of the solution. The system further includes a pump for moving the solution from the container to the proximity head system, where the pump applies at least a minimum shear stress on the solution. The pump provides agitation that exceeds the finite yield stress that transforms the stable elastic gel to liquid. A head of the proximity head system receives the solution that is configured to be applied to the surface of the substrate in the form of the meniscus. The meniscus can either be in a two-state form or a tri-state form, depending on the application.

In still another embodiment, a substrate cleaning system is disclosed. The system includes a jet application system for applying a solution to a surface of a substrate during a cleaning operation. A container holding the solution is provided. The solution is mixed from at least a continuous medium, a polymer material, and solid material, and the polymer material in the solution imparts a finite yield stress to the material, such that the solution is maintained in a stable elastic gel form. The stable elastic gel form is configured to hold the solid material form in place and prevent the solid material from moving in the solution if stresses less than the finite yield stress is imparted on the solution after synthesis of the solution and during any storage of the solution. A pump is provided for moving the solution from the container to the jet application system, and the pump applies at least a minimum shear stress on the solution. The pump provides agitation that exceeds the finite yield stress that transforms the stable elastic gel to liquid. And, the jet sprays the solution to the surface of the substrate so as to remove unwanted contaminants.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for methods, systems for use, and methods for making materials for use in preparation of substrates, which may be used in the semiconductor industry. In one embodiment, the material is defined as a solution that can be used in the preparation of substrates. "Preparation", broadly defined, includes the cleaning, etching, depositing, removing, or altering of surfaces of substrates, and in particular, the cleaning of particulates, contaminants or unwanted materials, layers, or surfaces form a substrate. A "substrate," as an example used herein, denotes without limitation, semiconductor wafers, hard drive disks, optical discs, glass substrates, and flat panel display surfaces, liquid crystal display surfaces, etc., which may become contaminated during manufacturing or handling operations. Depending on the actual substrate, a surface may become contaminated in different ways, and the acceptable level of contamination is defined in the particular industry in which the substrate is handled.

The solution, defined herein, is a suspended solution, that is engineered to suspend solids within a polymer network material. The polymer network defines a physical network that behaves as an elastic solid when deformed with stresses below its yield value. The solution includes at least a continuous medium (e.g., water), a polymer, and solids (e.g., fatty acids). The solids, although may have some buoyancy relative to the continuous medium of the solution, will be held in place, and thus will not be allowed to either sink or float. If the solids were to sink or float, the solution would have to be re-mixed before use, with may introduce downtime or uncertainty in the degree of mixing needed to produce a ready to use solution.

As will be described below, the polymer of the solution is configured to make the solution behave like a viscoplastic fluid (e.g., gel-like), which will suspend and hold the solids in place within the mixed solution. The solution, which in one embodiment acts like a physical gel, has a finite yield stress that is greater than the stress from the buoyancy force of the suspended solids, thus preventing sedimentation or creaming, which stabilizes the solution. In addition, the stabilizing macromolecules of the polymer give the solution elasticity, which enhances contamination removal.

It will be obvious, however, to one skilled in the art, that the present invention may be practiced without some or all of these specific details. In other instances, well known process operations have not been described in detail in order not to unnecessarily obscure the present invention.

Figure 1:
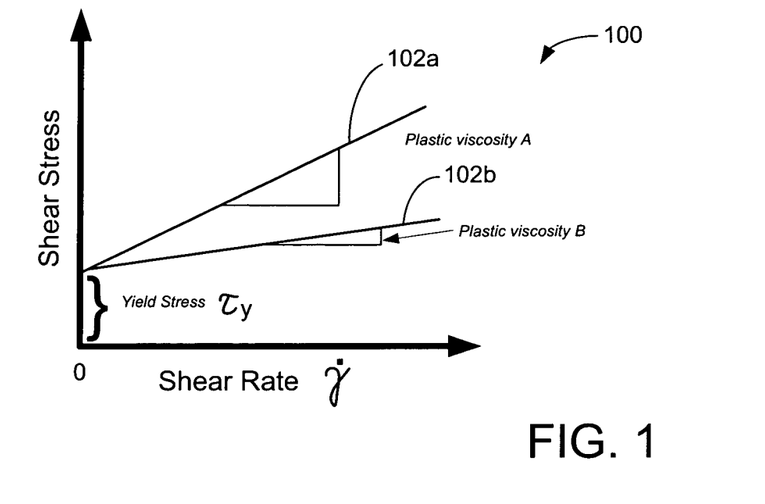
FIGS. 1 and 2 illustrate mechanics of the solution, in accordance with one embodiment of the present invention.

FIG. 1 illustrates a graph 100 which plots shear stress in the Y-axis versus shear rate in the X-axis. Graph 100 is provided to illustrate a plot 102a and a plot 102b, each of which define a different plastic viscosity. Plot 102a will have a plastic viscosity A and plot 102b will have a plastic viscosity B, which is distinguished by the graphed slope. As shown, each of plots 102a and 102b begin at X-axes, at zero. A viscoplastic fluid will therefore possess a yield stress, $\tau_y$, that must be exceeded before the viscoplastic fluid will deform continuously. Below the yield stress, only elastic deformation occurs on the viscoplastic fluid. Once the yield stress is exceeded, the viscoplastic fluid will begin to deform continuously, and as additional shear stress is applied, the shear rate will increase proportionally; the proportionality constant is the viscosity of the viscoplastic fluid.

Examples of viscoplastic fluids may include materials, but not limited to, materials commonly referred to as "Bingham plastics." Bingham plastics exhibit a linear behavior of shear stress versus the shear rate, as defined in FIG. 1. The higher the shear rate that is applied to the viscoplastic fluid, the more the viscosity drops, which allows the viscoplastic fluid to exhibit Newtonian characteristics. As used herein, Newtonian fluids are those that will adhere to the rheological definition of Newton's Law of viscosity.

A non-Newtonian fluid, as used herein, is a fluid in which the viscosity changes with an applied shear stress. A non-Newtonian fluid does not obey Newton's Law of viscosity. The shear stress is a non-linear function of the shear rate. Depending on how the apparent viscosity changes with shear rate, the flow behavior will also change. An example of a non-Newtonian fluid is a soft condensed matter which occupies a middle ground between the extremes of a solid and a liquid. The soft condensed matter is easily deformable by external stresses and examples of the soft condensed matter include emulsions, gels, colloids, foam, etc. It should be appreciated that an emulsion is a mixture of immiscible liquids such as, for example, toothpaste, mayonnaise, oil in water, etc.

For additional information regarding the functionality and constituents of Newtonian and non-Newtonian fluids, reference can be made to: (1) U.S. application Ser. No. 11/174,080, filed on Jun. 30, 2005 and entitled "METHOD FOR REMOVING MATERIAL FROM SEMICONDUCTOR WAFER AND APPARATUS FOR PERFORMING THE SAME"; (2) U.S. patent application Ser. No. 11/153,957, filed on Jun. 15, 2005, and entitled "METHOD AND APPARATUS FOR CLEANING A SUBSTRATE USING NON-NEWTONIAN FLUIDS"; and (3) U.S. patent application Ser. No. 11/154,129, filed on Jun. 15, 2005, and entitled "METHOD AND APPARATUS FOR TRANSPORTING A SUBSTRATE USING NON-NEWTONIAN FLUID," each of which is incorporated herein by reference.

Figure 2:
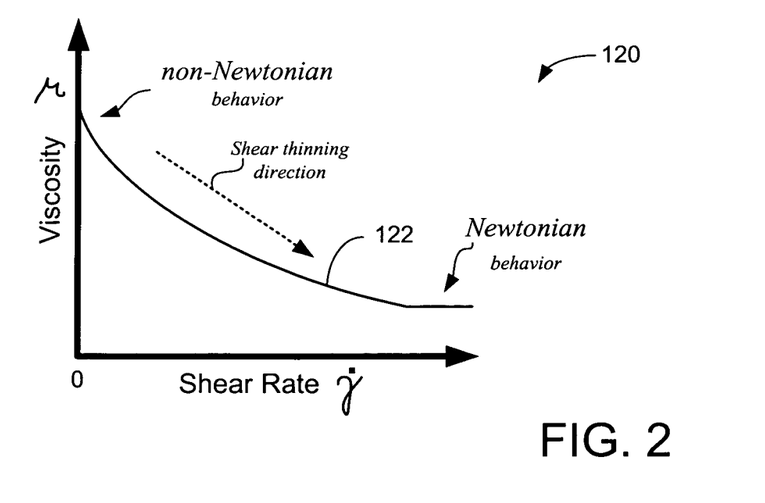

FIG. 2 illustrates a graph 120 that plots shear rate in the X-axes versus viscosity in the Y-axes. A curve 122 is shown to illustrate the mechanics of shear thinning when a viscoplastic fluid experiences an increase in shear rate. In essence, the viscosity of the viscoplastic fluid will drop along the curve 122 as the shear rate increases. As the shear thinning direction illustrates, the more shear rate that is applied to the viscoplastic fluid, the characteristic of a non-Newtonian behavior will change into a more Newtonian behavior, as the shear rate increases. Accordingly, the viscoplastic fluid will be in a substantially stable and substantially elastic solid form (i.e., substantially non-deformed state) when the shear rate is zero, as illustrated in both FIGS. 1 and 2. However, as the shear rate increases, the viscosity will drop, having crossed the critical yield stress point, to cause the transformation of the viscoplastic fluid from a substantially solid elastic form to a substantially fluid form. The shear thinning process is therefore one in which the apparent viscosity of the fluid decreases with increasing shear rate. This type of behavior may also be referred to as "pseudoplastic", and no initial stress (yield stress) is required to initiate shearing.

With the mechanics of viscoplastic fluids in mind, one embodiment of the present invention will define a solution that is constructed so as to place the solution into a substantially stable suspended form. The substantially stable suspended form will be one that is substantially elastically solid and non-flowing. Some elastic movement may occur, similar to the movement of jelly. Further, the stable suspended form will hold in place (i.e., suspend) any constituents that define the solution. The solution will therefore exhibit a viscoplastic behavior, such that a minimum yield stress will be required to be applied to the solution before the solution can be used and applied in the form of a Newtonian fluid.

Figure 3:
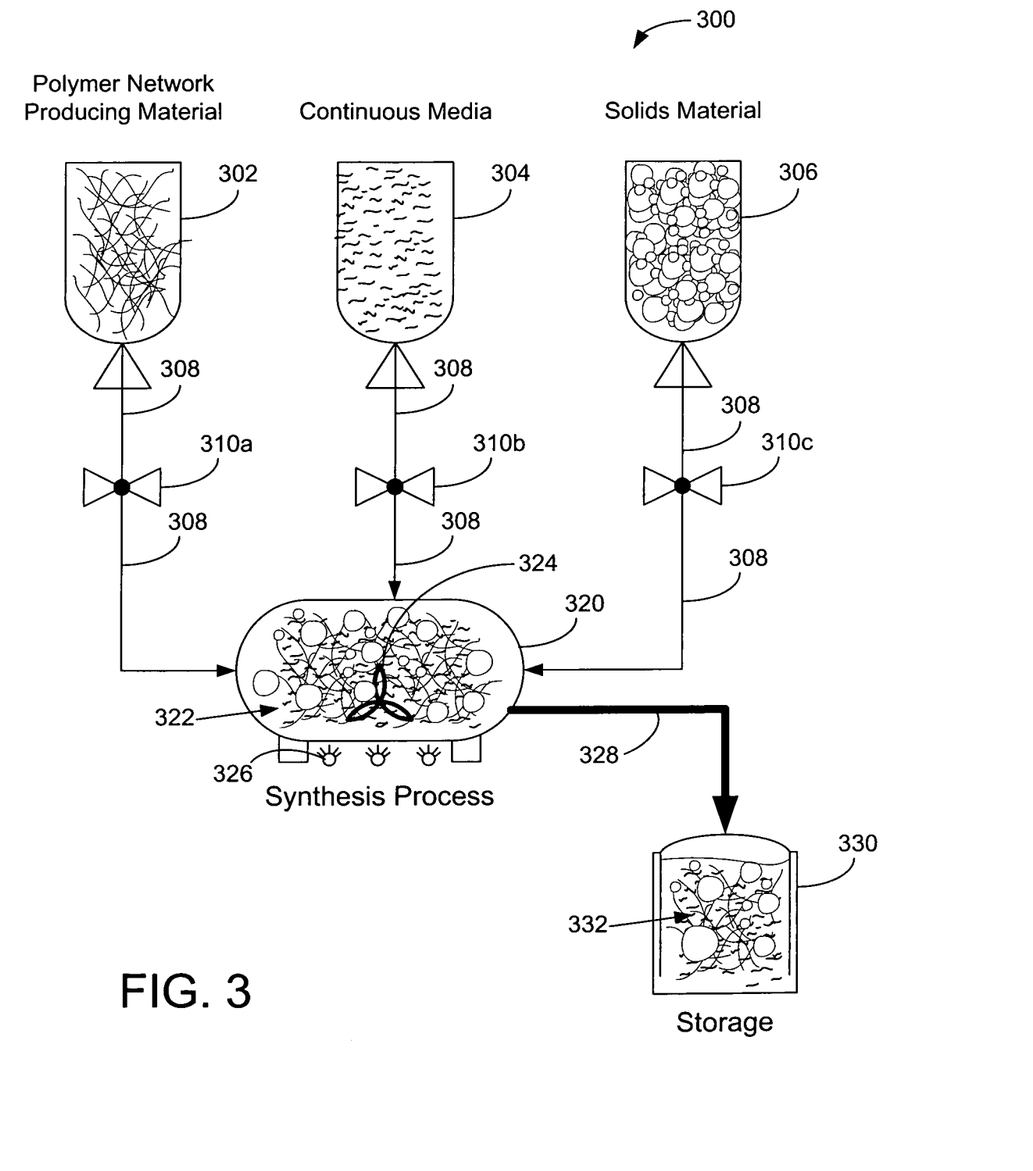
FIG. 3 illustrates an example of the mixing of the main constituents of the solution, in accordance with one embodiment of the present invention.

FIG. 3 illustrates a system diagram 300 identifying constituents that may be mixed together to define a suspended solution having a viscoplastic fluid characteristic, in accordance with one embodiment of the present invention. The basic components of the solution, in accordance with one embodiment of the present invention, will be three components. Other parts, fluids, chemicals, or additives may also be added, but the basic elements are defined by the three shown in FIG. 3. Thus, a first component will be a polymer network producing material 302, a second component will be a continuous media 304, and the third component will be a solid material 306. The polymer network producing material 302 is preferably a polymer, such as a poly (acrylic acid) that is capable of defining a polymer network when combined with the other components of the solution.

Examples of the polymer material used to define the polymer network producing material 302 is now provided. In one embodiment, without limitation, polymers capable of absorbing a yield stress without substantial deformation may include, without limitation, Carbapol, Stabileze, Rheovis ATA and Rheovis ATN, Poly(acrylic acid), Carageenan, Methylcellulose, Hydroxypropylmethylcellulose, Hydroxyethylcellulose, Gum Arabic (Acacia), Gum Tragacanth, Polyacrylates, Carbomer, etc. However, it should be understood that although different types of polymer material may be used, the selected polymer should be one that will allow the resulting solution to produce a network that will assist in stabilizing the solution into an elastic solid state.

Broadly, the continuous media 304 may be de-ionized water, a hydrocarbon, selected base fluids, hydrofluoric acid (HF), ammonia, and other chemicals and/or mixtures of chemicals in DI water, that may be useful in cleaning surfaces of semiconductor substrates. In specific examples, the continuous media 304 is an aqueous liquid defined by water (de-ionized or otherwise) alone. In another embodiment, an aqueous liquid is defined by water in combination with other constituents that are in solution with the water. In still another embodiment, a non-aqueous liquid is defined by a hydrocarbon, a fluorocarbon, a mineral oil, or an alcohol, among others. Irrespective of whether the liquid is aqueous or non-aqueous, it should be understood that the liquid can be modified to include ionic or non-ionic solvents and other chemical additives. For example, the chemical additives to the liquid can include any combination of co-solvents, pH modifiers (e.g., acids and bases), chelating agents, polar solvents, surfactants, ammonia hydroxide, hydrogen peroxide, hydrofluoric acid, potassium hydroxide, sodium hydroxide, tetramethylammonium hydroxide, and rheology modifiers such as polymers, particulates, and polypeptides.

The solids material 306, in one embodiment, may be defined by aliphatic acids, carboxylic acids, paraffin, wax, polymers, polystyrene, resins, polypeptides, and other viscoelastic materials. In one embodiment, the solid portion 306 material should be present at a concentration that exceeds its solubility limit within the continuous media 304. Also, it should be understood that the cleaning effectiveness associated with a particular solid material may vary as a function of temperature, pH, and other environmental conditions.

The aliphatic acids represent essentially any acid defined by organic compounds in which carbon atoms form open chains. A fatty acid is an example of an aliphatic acid that can be used as the solid material. Examples of fatty acids that may be used as the solid include lauric acid, palmitic acid, stearic acid, oleic acid, linoleic acid, linolenic acid, arachidonic acid, gadoleic acid, eurcic acid, butyric acid, caproic acid, caprylic acid, myristic acid, margaric acid, behenic acid, lignoseric acid, myristoleic acid, palmitoleic acid, nervanic acid, parinaric acid, timnodonic acid, brassic acid, clupanodonic acid, lignoceric acid, cerotic acid, and mixtures thereof, among others. In one embodiment, the solids material 306 can represent a mixture of fatty acids defined by various carbon chain lengths extending from C-1 to about C-26 (fatty acids only have an even number of carbons). Carboxylic acids are defined by essentially any organic acid that includes one or more carboxyl groups (COOH). The carboxylic acids can include mixtures of various carbon chain lengths extending from C-1 through about C-100. Also, the carboxylic acids can include long-chain alcohols, ethers, and/or ketones, above the solubility limit in the continuous medium 304. In one embodiment, the fatty acid used as the solid acts as a surfactant when coming into contact with a contaminant particle on a surface of a substrate.

The polymer network producing material 302, the continuous media 304, and the solids material 306 are then passed through lines 308, by way of valves 310a, 310b, and 310c, which provide the material to a synthesis container 320. Control may be by way of computer control or manual control. The lines 308 and the valves 310 are illustrated to show structure that can be used for transporting fluids and controlling access to fluids that may be delivered to a receiving source. However, it should be understood that any number for structures are possible, so long as the fluids can be communicated to their desired location for processing, storing, or use. In this example, synthesis container 320 may be a beaker, a tank, a mixing manifold, a staging pipe, a holding cylinder, a container capable of being pressurized, a temperature controlled tank, or any type of structural container that will hold at least the received materials from the polymer network producing material 302, the continuous media 304, and the solids material 306. The materials from 302, 304, and 306 may be provided directly through facilities, and may not necessarily be pre-stored in a container, but for ease of illustration, containers are shown providing their contents in a controlled manner, as dictated by a human or computer, to the synthesis container 320. The synthesis container 320 may be provider with a mixer 324, that will enable the synthesis container to mix the constituents, at given times, when introduced into the synthesis container 320.

The result of mixing and synthesizing the different constituents in the synthesis container 320 will be to produce a suspended solution 322. The suspended solution, when mixed and synthesized, is provided with a heat source 326, that is controlled so as to enable temperature specific mixing, blending, and/or dissolving of the various constituents at specific times. The resulting suspended solution 322 is then moved to a container 330, by way of an output flow line 328. The output flow line may be any type of conduit or conduits, that can transfer the suspended solution 322 from the synthesis container 320 to the container 330. Initially, when the suspended solution 322 is moved from the synthesis container 322, a minimum shear stress may be applied so as to cause the viscoplastic nature of the suspense solution 322 to flow along the output flow line 328 and into container 330.

Once the suspended solution 322 is transferred to the container 330, the suspended solution may continue to ripen over time, such that nucleation of the solids will occur, and the solids will either join or grow together so as to produce larger sized solids within the suspended solution 322. During the ripening process, however, the solids within the suspended solution 322 will be suspended by the polymer network material so that the solids do not either rise to the top of the container 330 or fall to the bottom of the container 330.

That is, although the buoyancy of each of the individual suspended solids (relative to the continuous medium) within the suspended solution 322 will impact the solid's tendency to either float or sink, any tendency to move will be counteracted by the polymer network of the suspended solution 322. The solids will therefore remain in a substantially elastic suspension until the solution needs to be used. When the suspended solution 322 is needed for use or needs to be transported, the yield stress of the suspended solution 322 will need to be overcome, so that the solution can experience shear thinning as the shear rate increases.

Figure 4:
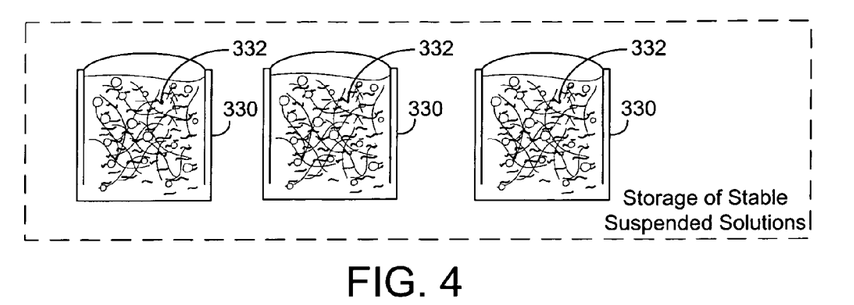
FIG. 4 illustrates an example of several containers, which may be stably stored in an elastic gel-like form, in accordance with one embodiment of the present invention.

FIG. 4 illustrates a plurality of containers 330 having solids dispersed in a suspended solution, which will sit, hold and store in a substantially elastic state (e.g., a solid). As noted above, the solid state of the solution is therefore designed to function as a viscoplastic fluid that is elastic, and any buoyancy associated with solids within the continuous medium of the suspended solution 332 will remain substantially in place. As such, the suspended solution 332 will be ready for use in a well dispersed manner, and any storage associated with the solution will not require pre-use mixing, as the suspended solution and its constituents are already in a dispersed and mixed form.

Advantages of having the solution in a viscoplastic fluid state is that the solution may be pre-mixed in larger batches, and then stored and transported to their point of use. If use of the solution is not needed until a later point in time, the solution will continue to hold its dispersed and stable suspended form until its use is dictated.

Figure 5:
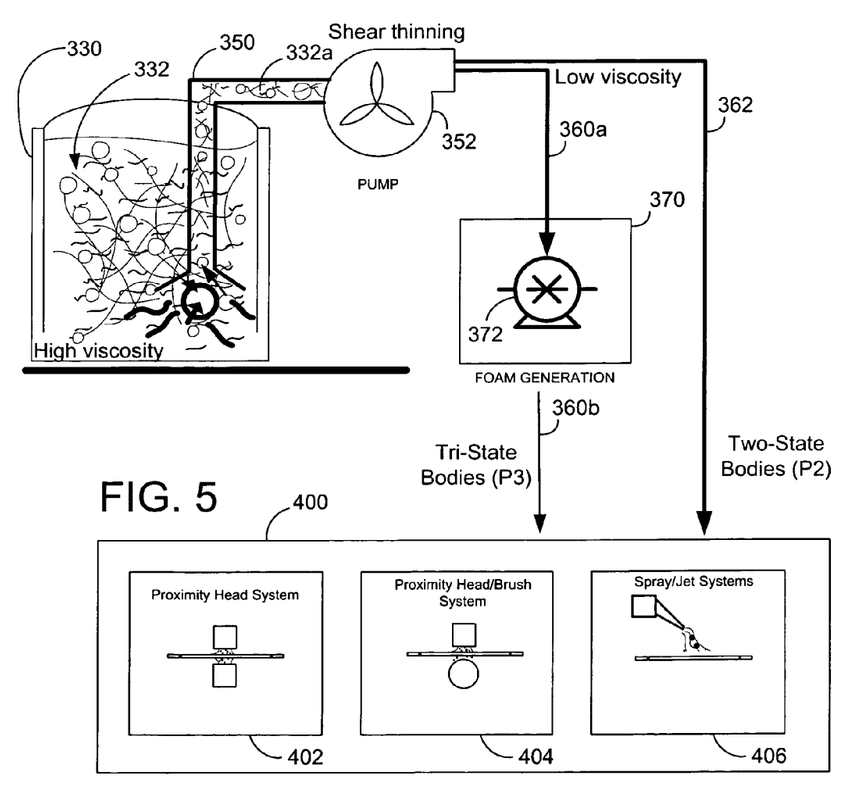
FIG. 5 illustrates an example use of the solution, which transforms the solution from the stable gel-like form to a low viscosity fluid through shear thinning, in accordance with one embodiment of the present invention.

FIG. 5 illustrates a system diagram for using the suspended solution from a container 330, when its use is required on substrate preparation systems 400. As illustrated, the container 330 will be holding the suspended solution 332. When use of the suspended solution 332 is needed, the solution may be pumped out of the container 330 using a pump 352. The pump 352 is shown connected to a conduit 350 that is placed within the suspended solution 332. The agitation provided by the pump 352 will therefore work to apply a shear stress to the suspended solution 332, which therefore causes a shear stress application zone 344 (somewhere in the container) to cause the solution (or at least part of the solution) to flow continuously. The lower viscosity fluid will thus freely move along the conduit 350, as shown by indicator 332a. The flowing solution will then be transported by the pump 352, that directs the fluid to some destination.

Thus, the pump 352 acts to transport the suspended solution 332, and the shear thinning behavior of the suspended solids allows for easy transport through conduits 360a and 362. In one embodiment, the pump 352 may be connected to flow the low viscosity solution through conduit 360a into a foam generation system 370. The foam generation system 370 may include a gas pressure chamber 372 that is configured to allow a foaming process to occur to the solution before it is communicated through a conduit 360b. Conduit 360b will therefore carry the solution in a tri-state body form to one or more systems of the substrate preparation systems 400. A tri-state body is one where a "gas" component is added to the "fluid" component and the "solids" component of the solution. A tri-state body will be defined in greater detail below.

In another embodiment, the pump 352 may simply communicate the solution along conduit 362, in a two-state body to the substrate preparation system 400. A two-state body is one that has a "fluid" component and a "solids" component, but substantially no "gas" component. It is said that substantially no gas is part of a two state body solution, but some gas may be inherently in the solution.

The substrate preparation system 400 may include any number of systems, and a few are provided as an example. One example system may be a proximity head system 402, that uses a proximity head to apply a meniscus to the surface of a substrate between a head surface and the substrate surface. One proximity head on the top of the substrate may be used, or two proximity heads may be used, such that both the top and bottom of the substrate is processed at about the same time.

In one embodiment, the substrate is caused to move along a horizontal direction, such that the meniscus is caused to traverse the surface of the substrate. In another embodiment, the heads of the proximity head system may be moved across the surface of the substrate.

A "meniscus", as used herein, may be a controlled fluid meniscus that forms between the surface of a proximity head and a substrate surface, and surface tension of the fluid holds the meniscus in place and in a controlled form. Controlling the meniscus is also ensured by the controlled delivery and removal of fluid, which enables the controlled definition of the meniscus, as defined by the fluid. The meniscus may be used to either clean, process, etch, or process the surface of the substrate. The processing on the surface may be such that particulates or unwanted materials are removed by the meniscus. In a related embodiment, the meniscus may be formed out of a tristate body (e.g., a foamed solution), and the solution may simply sit on the surface at the substrate, but mechanically function different than fluid solutions that are affected by surface tension. A foamed solution behaves more like a non-Newtonian fluid.

A Newtonian meniscus fluid, however, is controlled by supplying a fluid to the proximity heads while removing the fluid with a vacuum in a controlled manner. Optionally, a gas tension reducer may be provided to the proximity heads, so as to reduce the surface tension between the meniscus and the substrate. The gas tension reducer supplied to the proximity heads allow the meniscus to move over the surface of the substrate at an increased speed (thus increasing throughput). An example of a gas tension reducer may be isopropyl alcohol mixed with nitrogen (IPA/$N_2$). Another example of a gas tension reducer may be carbon dioxide (CO2). Other types of gasses may also be used so long as the gasses do not interfere with the processing desired for the particular surface of the substrate.

For more information on the formation of a meniscus and the application to the surface of a substrate, reference may be made to: (1) U.S. Pat. No. 6,616,772, issued on Sep. 9, 2003 and entitled "METHODS FOR WAFER PROXIMITY CLEANING AND DRYING,"; (2) U.S. patent application Ser. No. 10/330,843, filed on Dec. 24, 2002 and entitled "MENISCUS, VACUUM, IPA VAPOR, DRYING MANIFOLD," (3) U.S. Pat. No. 6,998,327, issued on Jan. 24, 2005 and entitled "METHODS AND SYSTEMS FOR PROCESSING A SUBSTRATE USING A DYNAMIC LIQUID MENISCUS," (4) U.S. Pat. No. 6,998,326, issued on Jan. 24, 2005 and entitled "PHOBIC BARRIER MENISCUS SEPARATION AND CONTAINMENT, " and (5) U.S. Pat. No. 6,488,040, issued on Dec. 3, 2002 and entitled "CAPILLARY PROXIMITY HEADS FOR SINGLE WAFER CLEANING AND DRYING," each is assigned to Lam Research Corporation, the assignee of the subject application, and each is incorporated herein by reference.

A next example is a proximity head-brush system 404. This example is provided to illustrate that the proximity head system may be combined with other types of cleaning systems, such brush rollers that are configured to scrub the surface of a wafer. The surface may be scrubbed either on top or bottom with a brush, and a proximity head system may be used either on the top or the bottom.

The brushes may be polyvinyl alcohol (PVA) brushes, that may provide fluids to the surface of the substrate while rotating. The fluids provided by the brushes may be provided through the brush (TTB) core and the fluids may be for cleaning, and/or etching, and/or configuring the surface of the substrate to be either hydrophobic or hydrophilic, depending on the application.

Another system may be a spray/jet system 406, which is configured to apply either the tri-state bodies or the two-state bodies to the surface of the substrate. Sprays and jets may be applied such that the solids in the tri-state bodies or two-state bodies can be efficiently dispensed so as to allow the appropriate preparation operation. For more information on jet application, reference may be made to U.S. application Ser. No. 11/543,365, filed on Oct. 4, 2006, entitled "Method and Apparatus for Particle Removal", and is herein incorporated by reference. In still another embodiment, a module can be configured as a tank. The tank can be filled with the solution, and a substrate (or batches of substrates) can be lowered into the tank and then removed from the tank. This type of substrate processing may be referred to as dipping. When the dipping occurs, the solution can either be in an elastic state or in a fluid state. The movement of the substrate into the solution may provide the needed shear stresses that will overcome the yield stress of the suspended solution 332.

The preparation operation may be for cleaning, drying, etching, transformation of surface states (e.g., hydrophobic/hydrophilic), and/or general cleaning to remove particles with the assistance of the solids, that are applied using the systems of the substrate preparation system 400.

It should be understood, however, that the container 330 and the suspended solution 332 may be stored for a period of time and when used, can be transformed from a substantial solid state to a fluid flowing Newtonian state, by the application of shear stresses that will overcome the yield stress of the suspended solution 332 so that it can flow and be applied to the surface of a substrate for its application. An example amount of minimum sheer stress may be between about 1 e-6 Pa and about 100 Pa. However, the exact amount will change depending on the combined elements of the particular solution.

By maintaining the suspended solution 332 in its suspended form, the problems associated with having solids either float to the surface, or sink to the bottom of a container, are avoided, and its dispersed and well mixed state will remain until the suspended solution is needed for application and use. Any downtime that would have been spent for re-adjusting the fluid to allow for a consistent distribution can now be avoided, and more throughput and efficient processing with the suspended solution can now be performed, and applied to substrates when needed.

Figure 6:
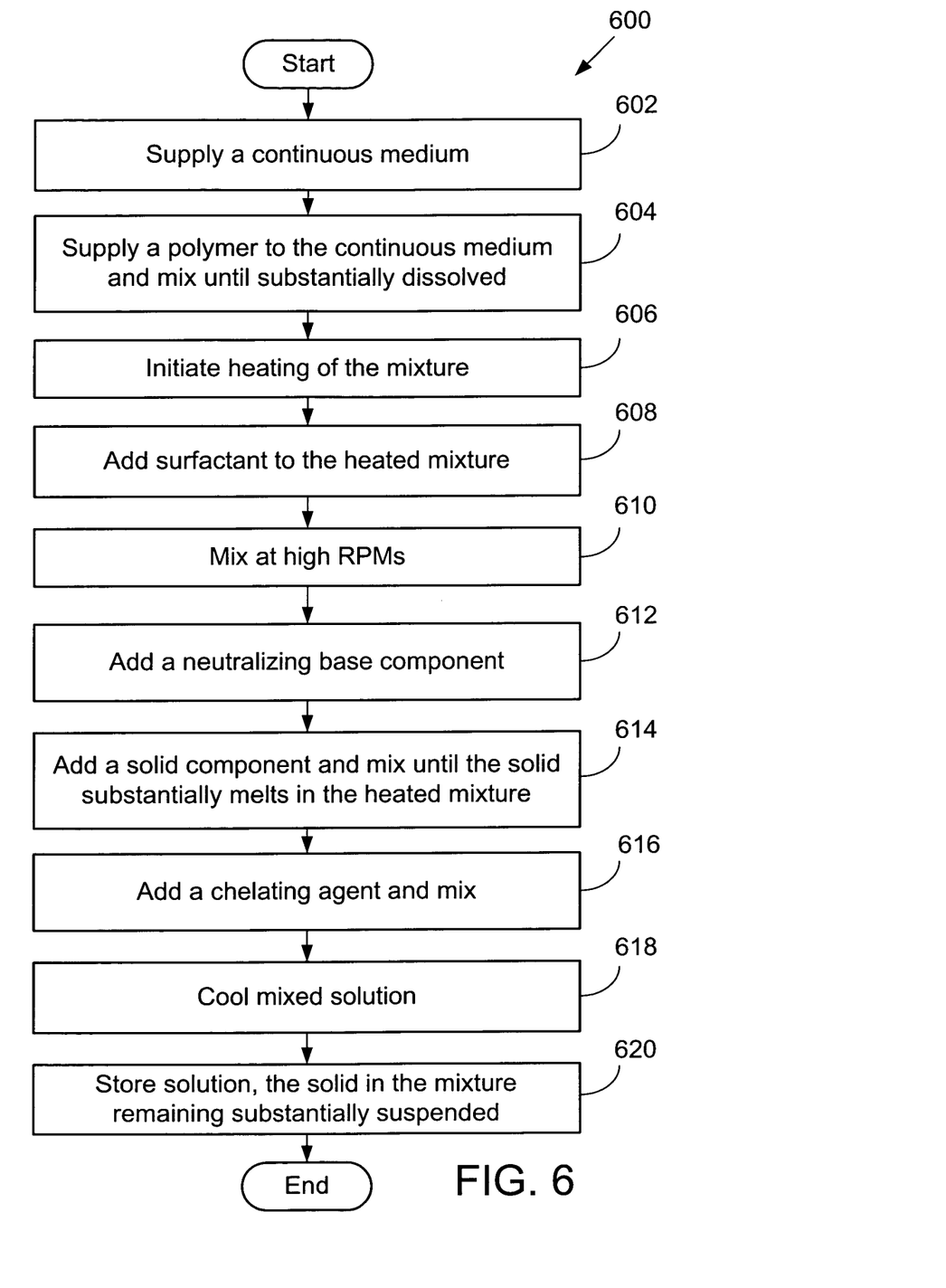
FIG. 6 illustrates one example method of making the solution, in accordance with one embodiment of the present invention.

FIG. 6 illustrates an example recipe 600 for generating a solution that will exhibit a substantial solid elastic state when stored, and then transformed to a substantial Newtonian fluid upon the application of shear stresses when the solution is needed. The recipe includes operation 602 where a continuous medium is supplied. As noted above, the continuous medium can be defined by a number of fluids and/or materials, but for this specific example, the continuous medium is de-ionized (DI) water.

The continuous medium is then supplied with a polymer, where it is mixed until it is substantially dissolved in the de-ionized water in operation 604. The mixed solution of 604 is them heated in operation 606. The heating of the solution should take place such that the temperature is between about 30° C. and about 100° C., and in one embodiment, between about 65° C., and about 85° C.

While the solution is heated, in operation 608, a surfactant is added to the mixture. The surfactant material is preferably one of ammonium lauryl sulfate, linear alkyl benzene sulfonic acic, triethanol amine lauryl sulfate, or a ionic surfactant. Once the surfactant has been added to the heated mixture in operation 608, the solution is continued to be mixed at a high RPM. An example of a high revolution per minute (RPM) may be between about 50 RPMs and about 1,500 RPMs. High RPM mixing should continue as long as possible, but without generating a noticeable froth layer. If some bubbles are created during this mixing operation, a minimum amount of bubbles would be allowable. In operation 612, a neutralizing base component will be added to the solution once the solution is again heated to a temperature range of between about 70° C. and about 80° C. In one embodiment, the neutralizing basic component is ammonia (i.e. NH4OH). Other neutralizing basic components may also work, for instance, tetramethyl ammonium hydroxide, triethanol amine, sodium hydroxide, potassium hydroxide can work.

In operation 614, immediately after the neutralizing basic component is added in operation 612, the solid component is added and mixed until the solid is substantially melted in the heated mixture. Mixing of the solid component in the solution in operation 614 will continue until the solid component is substantially dissolved in the solution. In operation 616, a chelating agent is added and then mixed. Other chelating agents may also work, for instance, EDTA, lactic acid, glycine, gluconic acid, citric acid may work. At this point, the solution is still preferably held at about a temperature range between 65° C. and about 85° C.

The solution will mix in operation 616, for between about 5 minutes and about 120 minutes. In operation 618, the solution is cool to about room temperature and then moved into a container, such as container 330 of FIG. 3. Alternatively, the solution will cool once moved to the container 330. During cooling, the solution will undergo nucleation until its end solid elastic state is reached and held. The final solution will appear to have a milky white color, and the viscosity of the solution. Further, during cooling, the solution will change in time, to a consistency having slightly more viscosity than water. At this point, the solution will behave like a viscoplastic, or equivalently like a Bingham plastic. In operation 620, the solution can be stored, having the solids (e.g., fatty acids) in a stable and substantial suspension.

In one embodiment, another example recipe for formulating a basic solution is defined in Table A. A beaker of having a size of about 1 liter, is used to illustrate an example formulation of the solution.

TABLE A (a) Add DI water to a beaker and begin to stir;
(b) Add a rheology modifier (e.g., polymer) to the solution and mix at high RPM until the component is dissolved;
(c) Begin to heat the solution to about 75° C.
(d) Add a surfactant component once the solution is around 50° C.
(e) Mix at a relatively high RPM (e.g., as high as possible without generating a noticeable froth layer), although it is fine if some bubbles are mixed into the solution.
(f) After the solution reaches 75° C., add a neutralizing basic component (e.g., NH4OH).
(g) Immediately after the base is added, add stearic acid (e.g., fatty acid).
(h) Mix for about 10 minutes, so that the stearic acid has substantially melted (adjust stirring rate maximize mixing - decrease mixing rate if too many bubbles).
(i) With the solution still at approximately 75° C., add a chelating agent.
(j) Mix for an additional 10 minutes.
(k) At this point the solution may be removed from the mixing source and cooled in a container (or stored for later use).

Figure 7:
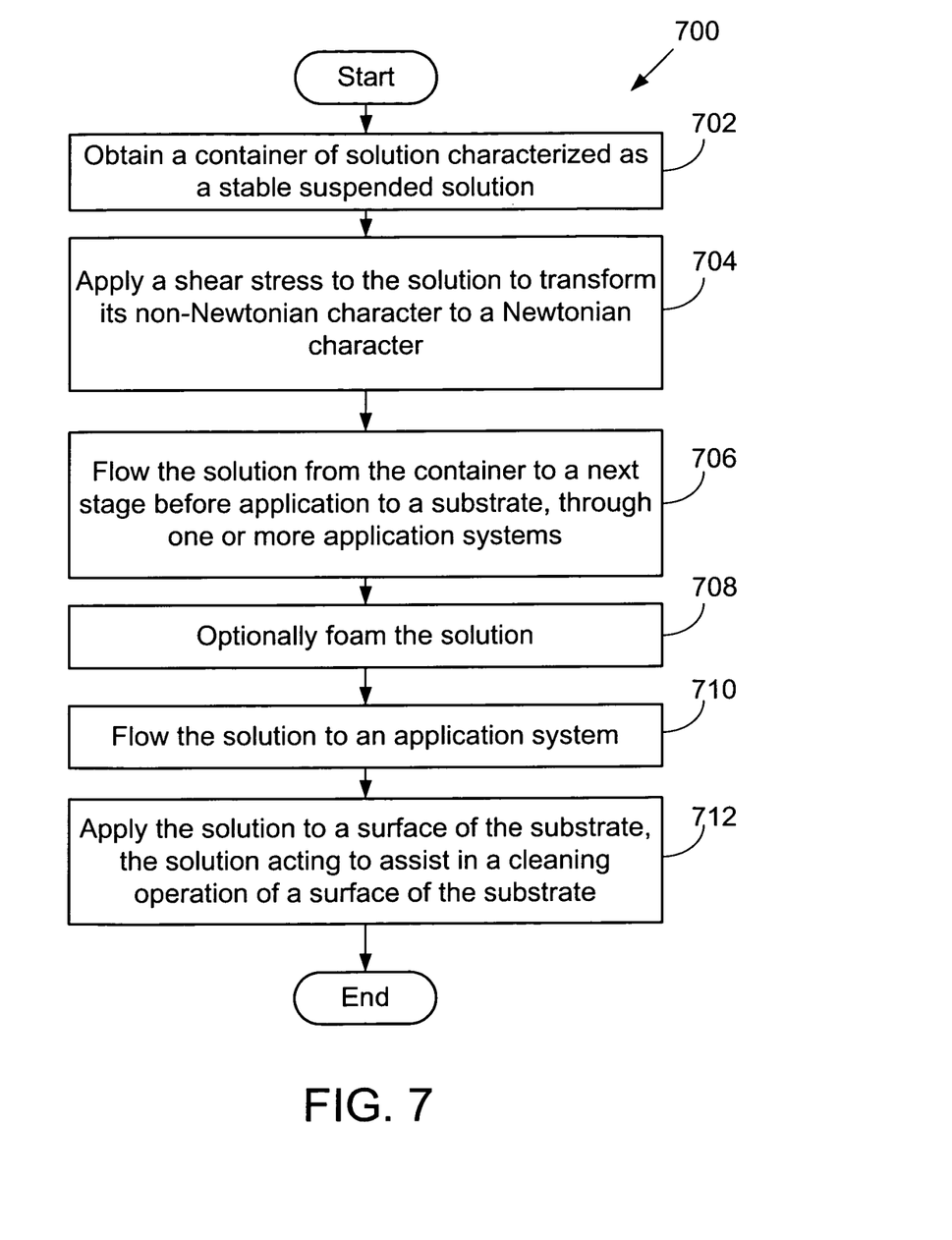
FIG. 7 illustrates one example method of using the solution, in accordance with one embodiment of the present invention.

FIG. 7 illustrates a flowchart 700 defining example operations for using the suspended solution, in accordance with one embodiment of the present invention. The method begins at operation 720, where a container of the solution characterized as a stable suspended solution is obtained. The solution may have been stored for some time, or may have just been created, and allowed to cool.

In either case, the container will hold a viscoplastic fluid that holds the solids in a suspended form, thus not allowing the buoyancy of the solids relative to the continuous medium to be overcome. In operation 720, a shear stress is applied to the solution to transform its non-Newtonian character to a Newtonian character. The non-Newtonian character is that of the viscoplastic material with a yield stress (e.g., exhibits a substantially solid form).

Once the shear stress is applied, as noted with reference to FIGS. 1 and 2, the viscoplastic material will shear thin until Newtonian behavior dominates in operation 704. In operation 706, the solution is allowed to flow from the container to a next stage, before application to a substrate, through one or more application systems. In operation 708, the solution is optionally foamed so as to create a tri-state body. If a tri-state body is not desired, the method moves to operation 710 where the solution in two-state form is flowed to an application system.

The application system may be any system such as those described with reference to FIG. 5, or any other system that may be involved in the cleaning of parts, surfaces, or semiconductor substrates. In operation 712, the solution is applied to a surface of a substrate. The solution will then act to assist in the cleaning operation of a substrate, where the solids assist in removing of particles that may be present on the surface.

As used herein, a tri-state body cleaning material contains a plurality of tri-state bodies that include a gas phase, a liquid phase and a solid phase. In one embodiment, the gas phase and liquid phase provides an intermediary to bring the solid phase into close proximity with contaminant particles on a substrate surface In one embodiment, the gas portion is defined to occupy 5% to 99.9% of the tri-state body cleaning material by volume. In another embodiment, the gas portion can occupy between about 15% and about 40% of the tri-state body, and still another embodiment, the gas portion can occupy between about 20% and about 30% of the tri-state body. The gas or gases defining a gas portion can be either inert, e.g., nitrogen ($N_2$), argon (Ar), etc., or reactive, e.g., oxygen ($O_2$), ozone ($O_3$), hydrogen peroxide ($H_2O_2$), air, hydrogen ($H_2$), ammonia ($NH_3$), hydrogen fluoride (HF), hydrochloric acid (HCl), etc. In one embodiment, the gas portion includes only a single type of gas, for example, nitrogen ($N_2$). In another embodiment, the gas portion is a gas mixture that includes mixtures of various types of gases, such as: ozone ($O_3$), oxygen ($O_2$), carbon dioxide ($CO_2$), hydrochloric acid (HCl), hydrofluoric acid (HF), nitrogen ($N_2$), and argon (Ar); ozone ($O_3$) and nitrogen ($N_2$); ozone ($O_3$) and argon (Ar); ozone ($O_3$), oxygen ($O_2$) and nitrogen ($N_2$); ozone ($O_3$), oxygen ($O_2$) and argon (Ar); ozone ($O_3$), oxygen ($O_2$), nitrogen ($N_2$), and argon (Ar); and oxygen ($O_2$), argon (Ar), and nitrogen ($N_2$). It should be appreciated that the gas portion can include essentially any combination of gas types as long as the resulting gas mixture can be combined with a liquid portion and a solid portion to form a tri-state body that can be utilized in substrate cleaning or preparation operations.

It should be understood that depending on the particular embodiment, the solid portion of the tri-state body may possess physical properties representing essentially any substate, wherein the solid portion is defined as a portion other than the liquid or gas portions. For example, physical properties such as elasticity and plasticity can vary among different types of solid portions within the tri-state body. Additionally, it should be understood that in various embodiments the solid portion can be defined as crystalline solids or non-crystalline solids. Regardless of their particular physical properties, the solid portion of the tri-state body should be capable of avoiding adherence to the substrate surface when positioned in either close proximity to or in contact with the substrate surface or capable of being easily removed (e.g., hydrodynamic removal with rinse). Additionally, the physical properties of the solid portion should not cause damage to the substrate surface during the cleaning process. Furthermore, the solid portion should be capable of establishing an interaction with the contaminant particle present on the substrate surface when positioned in either close proximity to or contact with the particle. In one embodiment, the solid portion has foam inhibiting properties. In another embodiment, the solid portion has foam enhancing properties. Depending on the application and the apparatus used to handle the tristate body, the foam enhancing or inhibiting properties can be adjusted, either in a stepped manner or in accordance with a recipe.

In one embodiment, the solid portion avoids dissolution into the liquid portion and gas portions and has a surface functionality that enables dispersion throughout the liquid portion. In another embodiment, the solid portions does not have surface functionality that enables dispersion throughout the liquid portion, therefore requiring chemical dispersants to be added to the liquid portion to before the solid portions can be dispersed through the liquid portion. In one embodiment, the solid portions form through a precipitation reaction where a dissolved component in the liquid phase reacts by the addition of one or more components to form an insoluble compound. In one embodiment, the solid portion goes into suspension in the liquid portion when a base is added to the liquid portion (i.e., by altering the zeta potential). Depending on their specific chemical characteristics and their interaction with the surrounding liquid portion, the solid portion may take one or more of several different forms.

For example, in various embodiments the solid portion may form aggregates, colloids, gels, coalesced spheres, or essentially any other type of agglutination, coagulation, flocculation, agglomeration, or coalescence. It should be appreciated that the exemplary list of solid portion forms identified above is not intended to represent an inclusive list, and alternates or extensions falling within the spirit of the disclosed embodiments are possible. It should further be understood that the solid portion can be defined as essentially any solid material capable of functioning in the manner previously described with respect to their interaction with the substrate and the contaminant particle.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A method for using a solution for cleaning a substrate, comprising:

provilding a solution in a container, the solution being mixed from at least a continuous medium, a polymer material, and a solid material, the polymer material in the solution imparting a finite yield stress to the solution, such that the solution is maintained in a stable elastic gel form, the stable elastic gel form being configured to hold the solid material in place and prevent the solid material from moving in the solution and forming sedimentation if stresses less than the finite yield stress is imparted on the solution after synthesis of the solution and during any storage of the solution;

applying at least a minimum shear stress on the solution, the minimum shear stress being at least greater than the finite yield stress so that the stable elastic gel exhibits fluid-like behavior;

flowing the solution from the container after imparting the minimum shear stress, the solution that is flown from the container has a mixed consistency of the solid material in the solution; and applying the solution to a preparation system for application to a surface of the substrate.

2. The method for using a solution for cleaning a substrate as recited in claim 1, wherein the solid material is a fatty acid defined by one of lauric acid, palmitic acid, stearic acid, oleic acid, linoleic acid, linolenic acid, arachidonic acid, gadoleic acid, eurcic acid, butyric acid, caproic acid, caprylic acid, myristic acid, margaric acid, behenic acid, lignoseric acid, myristoleic acid, palmitoleic acid, nervanic acid, parinaric acid, timnodonic acid, brassic acid, clupanodonic acid, lignoceric acid, or cerotic acid.

3. The method for using the solution for cleaning the substrate as recited in claim 1, wherein the continuous medium is one of de-ionized (DI) water, a hydrocarbon, a base fluid, a hydrofluoric acid (HF) solution, an ammonia based solution, or mixtures of DI water and chemicals.

4. The method for using the solution for cleaning the substrate as recited in claim 1, wherein the polymer material is one of Poly (acrylic acid), Carageenan, Methylcellulose, Hydroxypropylmethylcellulose, Hydroxyethylcellulose, Gum Arabic (Acacia), Gum Tragacanth, Polyacrylates, or Carbomer.

5. The method for using the solution for cleaning the substrate as recited in claim 1, wherein applying at least a minimum shear stress on the solution is imparted through pumping the solution from the container, the pumping providing agitation that exceeds the finite yield stress causing the solution to flow.

6. The method for using the solution for cleaning the substrate as recited in claim 1, wherein flowing the solution is from the container to the preparation system.

7. The method for using the solution for cleaning the substrate as recited in claim 6, wherein the preparation system is a proximity head system, the proximity head system applies the solution in the form of a meniscus between a surface of the proximity head and a surface of the substrate.

8. The method for using the solution for cleaning the substrate as recited in claim 7, wherein the proximity head system includes a first head for processing a first surface and a second head for processing a second surface.

9. The method for using the solution for cleaning the substrate as recited in claim 2, wherein the solid material has a concentration that exceeds a solubility limit within the continuous medium.

10. The method for using the solution for cleaning the substrate as recited in claim 1, further comprising:

(i) mixing the polymer material with the continuous medium at between about 50 revolutions per minute (RPM) up to about 1,500 RPMs;
(ii) heating the solution to about 75 degrees C. and adding a surfactant;
(iii) adding a neutralizing basic component;
(iv) mixing the solution when the solid material is added so that the solid material has substantially melted in the solution;
(v) adding a chelating agent while the solution is at about 75 degrees C.; and
(vi) cooling the solution to allow ripening.

11. The method for using the solution for cleaning the substrate as recited in claim 1, wherein the solid material nucleates to form larger sized solid material in the solution.

12. A method for using a solution for cleaning a substrate, comprising:

providing a solution in a container, the solution being mixed from at least a continuous medium, a polymer material, and a solid material, the polymer material in the solution imparting a finite yield stress to the solution, such that the finite yield stress is greater than a buoyancy force of the solid material and the solution is maintained in a stable elastic gel form, the stable elastic gel form being configured to hold the solid material in place and prevent the solid material from moving in the solution if stresses less than the finite yield stress is imparted on the solution after synthesis of the solution and during any storage of the solution;

applying at least a minimum shear stress on the solution, the minimum shear stress being at least greater than the finite yield stress so that the stable elastic gel exhibits fluid-like behavior;

flowing the solution from the container after imparting the minimum shear stress, the solution that is flown from the container has a mixed consistency of the solid material in the solution; and applying the solution to a preparation system for application to a surface of the substrate.

* * * * *